(12) United States Patent
Yamada

(10) Patent No.: US 7,504,844 B2
(45) Date of Patent: Mar. 17, 2009

(54) INSPECTION APPARATUS AND METHOD

(75) Inventor: Hiroshi Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/053,145

(22) Filed: Mar. 21, 2008

(65) Prior Publication Data
US 2008/0231298 A1    Sep. 25, 2008

(30) Foreign Application Priority Data
Mar. 23, 2007    (JP)    .............................. 2007-077924

(51) Int. Cl.
G01R 31/02    (2006.01)
(52) U.S. Cl. ..................................... 324/758
(58) Field of Classification Search ......... 324/754–758, 324/765, 158.1, 73.1; 250/306–307, 310–311
See application file for complete search history.

(56) References Cited

U.S. PATENT DOCUMENTS 7,221,176 B2 *    5/2007    Yoshioka et al. ............. 324/758
7,262,618 B2 *    8/2007    Komatsu .................... 324/758

* cited by examiner

*Primary Examiner*—Ha Tran T Nguyen
*Assistant Examiner*—Trung Q Nguyen
(74) *Attorney, Agent, or Firm*—Oblon, Spivak, McClelland, Maier & Neustadt, P.C.

(57) ABSTRACT

An inspection apparatus for inspecting electrical characteristics of an inspection target object includes a movable mounting table for mounting the inspection target object thereon, a probe card disposed above the mounting table, and one or more displacement sensors, provided at one or more location of the mounting table, each of the sensors measuring a distance between the mounting table and the probe card or a vicinity thereof. The inspection target object is brought into electrical contact with the probe card by overdriving the mounting table.

10 Claims, 4 Drawing Sheets

INSPECTION APPARATUS AND METHOD

FIELD OF THE INVENTION

The present invention relates to an inspection apparatus for performing an inspection of electrical characteristics of a target object such as a semiconductor wafer; and, more particularly, to an inspection apparatus and method for directly monitoring an overdriving amount of a mounting table when a target object on the mounting table is brought into electrical contact with probes of a probe card.

BACKGROUND OF THE INVENTION

As shown in FIG. 3, for example, a conventional inspection apparatus includes a main body 1; a mounting table 2 disposed in the main body 1 so as to be movable along X, Y, Z and θ directions while mounting thereon a target substrate (for example, a wafer W); a probe card 3 having a plurality of probes 3A to be brought into contact with a plurality of electrode pads formed on the wafer W loaded on the mounting table 2; a clamp mechanism 4 for fixing the probe card 3 through a card holder (not shown); and a connection ring 5 connecting the probe card 3 and a test head T electrically. The inspection apparatus performs an electrical inspection of the wafer W by receiving and transmitting test signals between a tester (not shown) and the electrode pads on the wafer W via the test head T, the connection ring 5 and the probe card 3. Further, in FIG. 3, a reference numeral 6 denotes an alignment mechanism for performing an alignment of the wafer W and the probe card 3 in cooperation with the mounting table 2, and reference numerals 6A and 6B represent an upper and a lower camera, respectively. Further, a reference numeral 7 denotes a head plate on which the clamp mechanism 4 is fixed.

To inspect the wafer W, an alignment of the wafer W and the probe card 3 is carried out by measuring positions of needles of the probes 3A by the lower camera 6B and measuring the electrode pads on the wafer W corresponding to the probes 3A by the upper camera 6A. After the alignment is completed, the inspection of the wafer W is then carried out. During the inspection, the wafer W and the probe card 3 are brought into contact with each other, and by overdriving the mounting table 2, the wafer W is allowed to be in electrical contact with the probes 3A, so that the inspection of the wafer W is carried out.

However, if the mounting table 2 is overdriven, a heavy contact load is imposed between the mounting table 2 and the probes 3A. If the contact load is excessively heavy, the wafer W would be damaged, whereas, if the contact load is insufficient, inspection reliability may not be achieved due to a contact failure or the like. In this regard, various techniques have been proposed to improve the inspection reliability by allowing the wafer W to make a contact with the probes 3A by a proper overdriving amount. Such techniques are described in Patent References 1 to 3, for example.

In the technique described in Patent Reference 1, there is disposed an optical length-measuring unit for measuring a vertical displacement of a probe card. In this technique, a lifting amount of a mounting table is controlled based on the displacement of the probe card obtained by the optical length-measuring unit, to thereby solve a problem of contact failure between the wafer and the probe card. Further, in the technique disclosed in Patent Reference 2, an overdriving amount of the mounting table can be appropriately set by measuring an absolute displacement of the probe card which is deformed when the mounting table is overdriven. Moreover, in the technique described in Patent Reference 3, the overdriving amount of the mounting table is controlled based on a relation between a sinking amount of the mounting table and a contact load during the overdriving. All of these techniques attempt to obtain an originally intended overdriving amount accurately by considering an influence of sinking of the mounting table and a deformation of the probe card during the overdriving.

(Patent Reference 1)
Japanese Patent Laid-open Application No. 2004-265895
(Patent Reference 2)
Japanese Patent Laid-open Application No. 2003-050271
(Patent Reference 3)
Japanese Patent Laid-open Application No. 2003-168707

However, some probe cards are of a type which makes a contact with a number of electrode pads formed on an entire surface of a wafer W simultaneously. In case of using such a probe card, inspection of electrical characteristic of the wafer W is carried out by allowing the probe card 3 to come into contact with the entire surface of the wafer W on the mounting table 2 simultaneously, as illustrated in FIG. 4. Since the wafer W and the probe card 3 make a contact with each other simultaneously, a contact load increases heavier than in the event that the probe card 3 makes contact with only a part of the wafer W. Besides, if the wafer W has a size of about 300 mm, the number of chips formed thereon increases remarkably along with the high integration of a semiconductor device. Therefore, the number of probes also increases greatly, so that a contact load due to the simultaneous contact between the probe card 3 and the wafer W also increases considerably.

As for a wafer W having a size of, for example, 300 mm, if the contact load due to the simultaneous contact between the probe card 3 and the wafer W increases over, for example, 60 kgf, the contact load exceeds the sum of a reaction force (indicated by an arrow C in FIG. 4) against a spring force of connection terminals (not shown) such as ring-shaped pogo pins arranged in a connection ring 5 as well as the weight of interface mechanism including the weight of the probe card 3 (indicated by an arrow A in FIG. 4) and the weight of the connection ring 5 (indicated by an arrow B in FIG. 4). Accordingly, if the mounting table 2 is lifted as indicated by an arrow D in FIG. 4 to overdrive it, the interface mechanism is lifted even after the occurrence of deformation of the probe card 3 and sinking of the mounting table 2.

Thus, even if the mounting table 2 is overdriven as intended originally, originally intended overdriving amount cannot be obtained and it is difficult to ascertain an accurate lifting amount of the mounting table 2 for achieving the required overdriving amount. Since the techniques of Patent References 1 to 3 do not consider the lifting of the interface mechanism, they cannot ascertain the lifting amount of the mounting table accurately.

SUMMARY OF THE INVENTION

In view of the foregoing, the present invention provides an inspection apparatus and method capable of detecting whether an overdriving amount of the mounting table reaches a desired level even in case an inspection target object and a probe card make contacts with each other simultaneously.

In accordance with a first aspect of the present invention, there is provided an inspection apparatus for inspecting electrical characteristics of an inspection target object including: a movable mounting table for mounting the inspection target object thereon; a probe card disposed above the mounting table; and one or more displacement sensors, provided at one or more location of the mounting table, each of the sensors measuring a distance between the mounting table and the probe card or a vicinity thereof, wherein, the inspection target object is brought into electrical contact with the probe card by overdriving the mounting table.

In accordance with a second aspect of the present invention, there is provided an inspection apparatus for inspecting electrical characteristics of an inspection target object including: a movable mounting table for mounting the inspection target object thereon; a probe card disposed above the mounting table; a control unit for driving and controlling the mounting table; and one or more displacement sensor, provided at one or more locations of the mounting table, each of the sensors measuring a distance between the mounting table and the probe card or a vicinity thereof. Herein, the control unit controls a lifting amount of the mounting table based on a measurement result of the displacement sensors, and an entire surface of the inspection target object is brought into electrical contact with the probe card simultaneously by overdriving the mounting table under the control of the control unit.

It is preferable that the number of sensors is greater than one and the displacement sensors may be provided at a peripheral portion of the mounting table to be distanced apart from each other at a regular interval.

Each of the sensors may be a capacitance sensor.

In accordance with a third aspect of the present invention, there is provided an inspection method for inspecting electrical characteristics of the inspection target object in an inspection apparatus, which includes a movable mounting table for mounting the inspection target object thereon, a probe card disposed above the mounting table, and a control unit for driving and controlling the mounting table, and the inspection target object is brought into electrical contact with the probe card by overdriving the mounting table under the control of the control unit. The method includes: measuring a distance between the mounting table and the probe card or a vicinity thereof by using one or more displacement sensors provided at the mounting table; and monitoring an overdriving amount of the mounting table based on a measurement result of the displacement sensors by the control unit.

It is preferable that the inspection method in accordance with a third aspect of the present invention further includes elevating the mounting table based on the measurement result of the displacement sensors by the control unit until a necessary overdriving amount is obtained.

The probe card may have a plurality of probes which come into contact with electrode pads of the inspection target object simultaneously.

The displacement sensors are preferably provided at plural equi-distanced locations along a circumferential direction of the mounting table.

In accordance with the present invention, it is possible to provide an inspection apparatus and method capable of detecting whether an overdriving amount of the mounting table reaches a desired level even in case an inspection target object is brought into contact with a probe card simultaneously.

BRIEF DESCRIPTION OF THE DRAWINGS

The above features of the present invention will become apparent from the following description of embodiments given in conjunction with the accompanying drawings, in which.

DETAILED DESCRIPTION OF THE EMBODIMENTS

Figure 1:
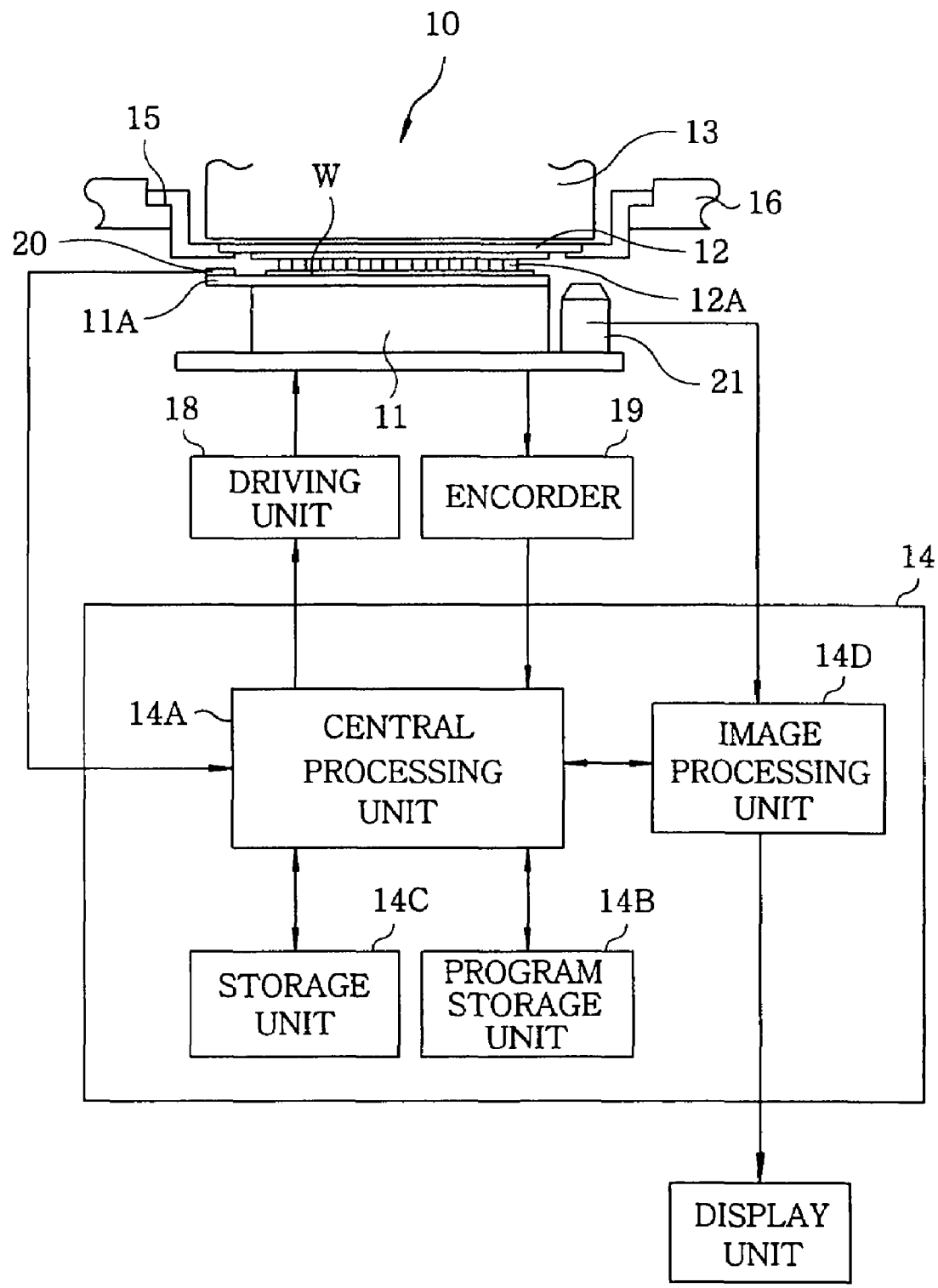
FIG. 1 is a configuration view of an inspection apparatus in accordance with an embodiment of the present invention.

Hereinafter, an embodiment of the present invention will be described with reference to FIGS. 1 and 2 which form a part hereof. FIG. 1 shows a configuration view of an inspection apparatus in accordance with the embodiment of the present invention, and FIG. 2 sets forth a configuration view showing major components thereof.

Figure 2:
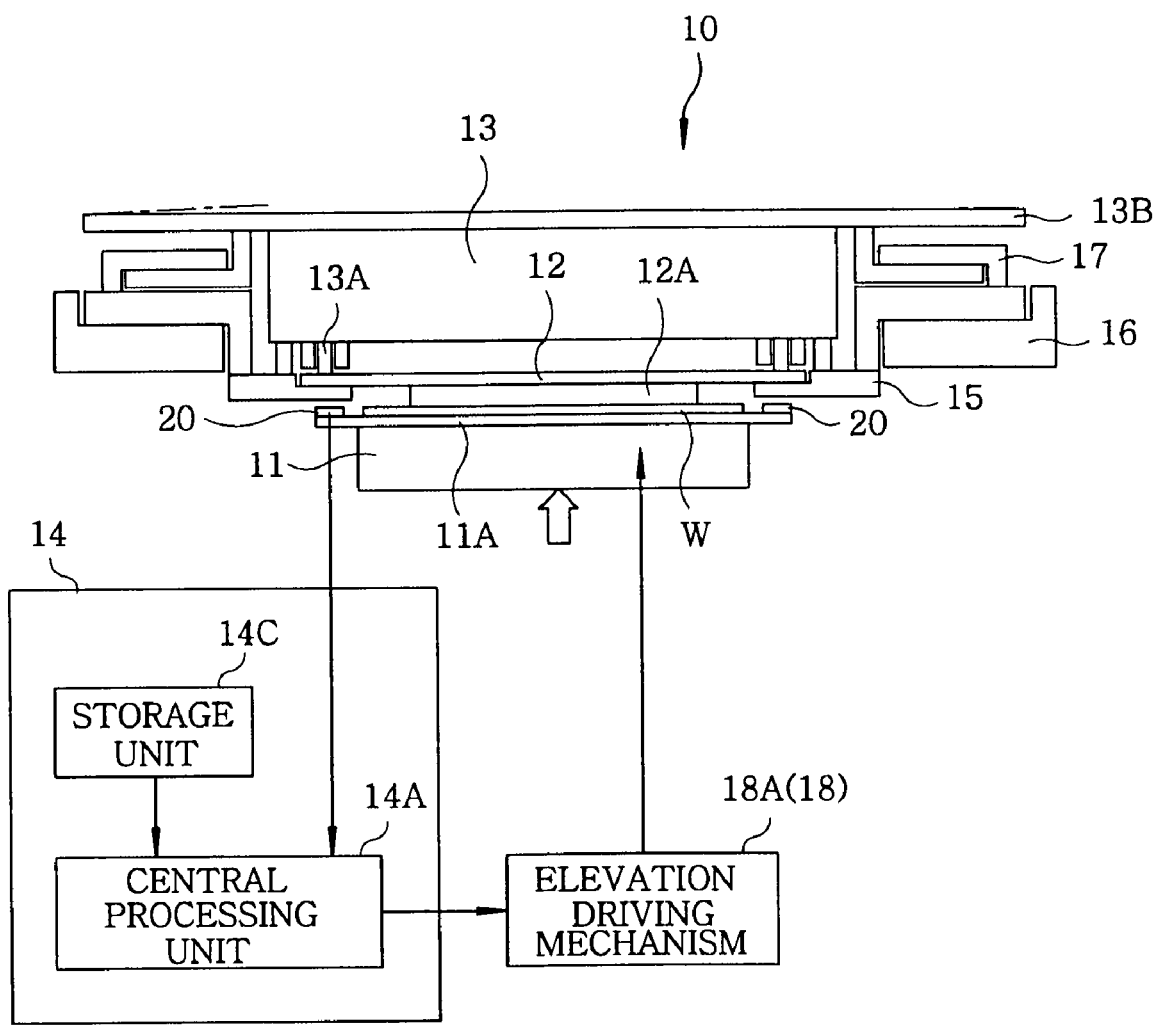
FIG. 2 sets forth a configuration view showing major components of the inspection apparatus of FIG. 1.
Figure 3:
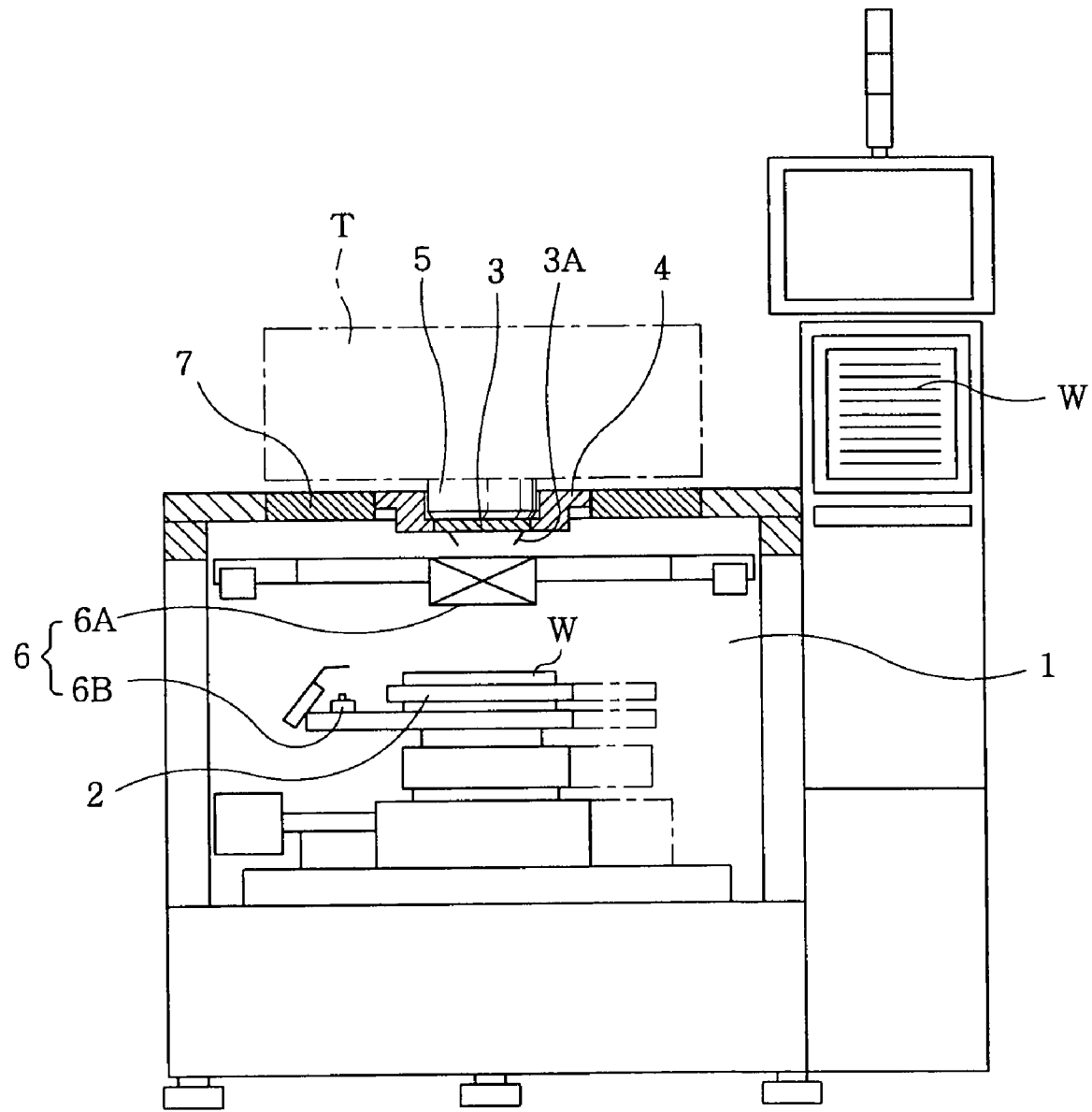
FIG. 3 presents a configuration view of a conventional inspection apparatus.
Figure 4:
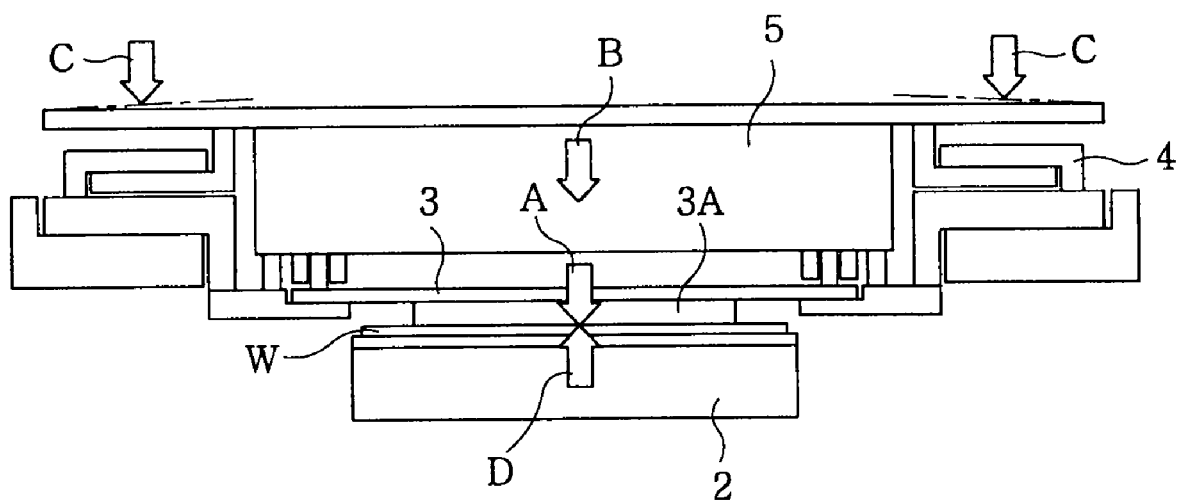
FIG. 4 depicts a configuration view showing major components of the inspection apparatus of FIG. 3.

As illustrated in FIG. 3, for example, an inspection apparatus 10 in accordance with the present embodiment includes a mounting table 11 for mounting thereon a target substrate (for example, a wafer W), the mounting table 11 being movable along X, Y, Z and θ directions; a probe card 12 disposed above the mounting table 11; a connection ring 13 connecting the probe card 12 and a test head (not shown) electrically; an alignment mechanism (not shown) for carrying out an alignment of the wafer W on the mounting table 11 and a plurality of probes 12A of the probe card 12; and a control unit 14 for controlling the individual constituent components. The probe card 12 is fixed to a clamp mechanism 17 (see FIG. 2) via a card holder 15, wherein the clamp mechanism 17 is fastened to the opening of the head plate 16.

The mounting table 11 includes, as shown in FIG. 1, a driving mechanism 18 and a measuring device 19 (for example, encoder). The mounting table 11 is moved along X, Y, Z and θ directions by the driving mechanism 18, and its movement is detected by the encoder 19. The driving mechanism 18 includes a horizontal driving unit (not shown) mainly having, for example, a motor and a ball screw, for driving an XY table on which the mounting table 11 is disposed; an elevation driving mechanism embedded in the mounting table 11; and a θ driving unit for rotating the mounting table 11 along a θ direction. The encoder 19 measures X-directional and Y-directional movement distances of the XY table based on a number of revolutions of the motor, and each measurement signal is transmitted to the control unit 14. The control unit 14 controls the driving mechanism 18 based on the signals from the encoder 19 and controls XY-directional movements of the mounting table 11.

Referring to FIGS. 1 and 2, the probe card 12 has the substantially same diameter as that of the wafer W, and it is provided with a number of probes 12A on its entire surface.

As shown in FIG. 2, all the probes 12A are brought into contact with the corresponding inspection electrode pads formed on the wafer W and are made to come into electrical contact with the wafer W by a predetermined overdriving amount so that it can inspect the chips on the wafer W in plural sets in sequence. Since the probe card 12 makes a contact with the entire surface of the wafer W simultaneously, a contact load over 60 kgf is imposed on the wafer W if the overdriving is carried out. If such a heavy contact load is applied on the mounting table 11, it would not only cause the deformation of the probe card 12 and sinking of the mounting table 11, but also cause the interface mechanism including the probe card 12 to be lifted up.

As a result, it becomes difficult to obtain an overdriving amount and a lifting amount for the mounting table 11 required to obtain a required overdriving amount also cannot be obtained accurately.

To elaborate, the interface mechanism includes the probe card 12 and the connection ring 13, as illustrated in FIG. 2.

The probe card 12 has a weight of, e.g., about 10 kgf, and the connection ring 13 has a weight of, e.g., 15 kgf. The connection ring 13 has a number of connection terminals 13A such as pogo pins arranged in a ring shape, and a spring force of the connection ring 13 amounts to about 35 kgf. The spring force applies to a peripheral portion of a motherboard 13B of the connection ring 13 from a test head (not shown) side as a spring reaction force. Accordingly, a total load of 60 kgf is imposed on the probe card 12.

Since, however, the contact load due to the simultaneous contact between the probe card 12 and the wafer W is over 60 kgf during the overdriving, the contact load exceeds the load of the probe card 12. As a result, the interface mechanism including the probe card 12 would be raised due to the contact load. Thus, even when the mounting table 11 is lifted by as much as an originally required overdriving amount, the required overdriving amount may not be obtained.

In the present embodiment, displacement sensors 20 (for example, capacitance sensors) for monitoring an overdriving amount are mounted on protrusion portions horizontally projected from the top plate 11A of the mounting table 11, as shown in FIGS. 1 and 2. These protrusion portions are provided at plural (for example, three) locations arranged at a same interval along the circumferential direction of the top plate 11A, and the displacement sensors 20 are installed at the respective protrusion portions. Each displacement sensor 20 measures a distance between a mounting surface of the top plate 11A and a bottom surface of the card holder 15, and outputs a measurement value to the control unit 14.

Since an overdriving amount is a lifting amount of the mounting table 11 lifted from a contact position between the probes 12A and the wafer W, the displacement sensor 20 detects the overdriving amount based on a reference value that is equivalent to a measurement value detected at the moment the wafer W comes into contact with the probes 12A simultaneously. If the measurement value of the displacement sensor 20 becomes smaller than the reference value, the reduced amount becomes the overdriving amount. That is, the overdriving amount can be calculated by obtaining the difference between the reference value and the measurement value by the control unit 14.

As shown in FIG. 1, the control unit 14 includes a central processing unit (CPU) 14A; a program storage unit 14B storing various programs therein; a storage unit 14C storing various data therein; and an image processing unit 14D for image-processing of image-pickup signals from the lower camera 21 and the upper camera(not shown). The programs stored in the program storage unit 14B are used to carry out an inspection method in accordance with the present invention, and are read and executed by the CPU 14A.

An originally intended overdriving amount is registered and stored in the storage unit 14C in advance as a registered overdriving amount. Further, the distance between the mounting surface of the top plate 11A and the bottom surface of the card holder 15 at the moment the electrode pads of the wafer W make contacts with the probes 12A is registered and stored in the storage unit 14C as a reference value for overdriving. As shown in FIG. 2, the CPU 14A receives the measurement values from the displacement sensors 20 and calculates a current overdriving amount (reduction in the distance between the mounting surface and the bottom surface of the card holder 15 after the contact between the wafer W and the probes 12A is made). Further, the CPU 14A compares the current overdriving amount with the registered overdriving amount stored in the storage unit 14C. If the current overdriving amount is found to be less than the registered overdriving amount, the CPU 14A lifts the mounting table 11, and the moment the current overdriving amount reaches the registered overdriving amount, CPU 14A sends a stop signal to the elevation driving mechanism 18A of the mounting table 11.

If the mounting table 11 is raised, the interface mechanism including the probe card 12 is lifted up due to the contact load, resulting in a deformation of the motherboard 13B as illustrated by a dashed dotted line of FIG. 2. Therefore, while the interface mechanism is being lifted up, the measurement values of the displacement sensors 20 hardly change and are maintained substantially constant although the mounting table 11 is raised. Thus, the control unit 14 makes a determination based on the measurement values from the displacement sensors 20 that the current overdriving amount does not reach the registered overdriving amount, and the mounting table 11 is further lifted. If the control unit 14 calculates the current overdriving amount based on the measurement values from the displacement sensors 20 and if the current overdriving amount is determined to reach the registered overdriving amount, the elevation driving mechanism 18A received a stop signal from the control unit 14 as shown in FIG. 2, and the mounting table 11 is stopped under the control of the control unit 14.

In the event that the measurement values from the three displacement sensors 20 at three different locations are same, it implies that the probe card 12 and the mounting surface of the mounting table 11 are arranged in parallel to each other. If the measurement values from the three displacement sensors 20 are different, however, it implies that the probe card 12 is inclined. As described, by using the displacement sensors 20 provided at the three different locations, it is possible to detect the parallelism of the probe card 12.

The alignment mechanism for performing an alignment of the wafer W and the probe card 12 includes, as shown in FIG. 1, the lower camera 21 disposed at the mounting table 11; an alignment bridge (not shown) which is moved between the mounting table 11 and the probe card 12 and advanced up to a probe center (directly under the center of the probe card 12); and the upper camera (not shown) installed at the alignment bridge. The lower camera 21 captures an image of the needles of the probes 12A with high and low magnifications under the control of the control unit 14, as conventionally known in the art, while the upper camera captures an image of the electrode pads of the wafer W with high and low magnifications. The alignment of the wafer W and the probe card 12 is carried out based on XYZ coordinate data obtained by the image data.

Now, an inspection method in accordance with the embodiment of the present invention, which is performed by using the inspection apparatus 10, will be described. As shown in FIGS. 1 and 2, if a wafer W is loaded on the mounting table 11, the alignment mechanism is driven to carry out an alignment of the wafer W and the probe card 12. After the completion of the alignment, the mounting table 11 is moved in X and Y directions, and the mounting table 11 is stopped at the moment the wafer W is located directly under the center of the probe card 12, the elevation.

Sequentially, the mounting table 11 is lifted so that all of inspection target electrode pads on the wafer W are brought into contact with the probes 12A of the probe card 12 simultaneously. A measurement value of the displacement sensors 20 at that moment is set as a reference value, and from this point in time, monitoring of an overdriving amount of the mounting table 11 is performed by the displacement sensors 20. The mounting table 11 is raised by a distance suitable for a registered overdriving amount from the reference value.

At this time, since the contact load on the probes 12A exceeds the weight of the interface mechanism including the probe card 12 and the connection ring 13, the interface mechanism is lifted up by the mounting table 11 as indicated by the dashed dotted line of FIG. 2. Therefore, the measurement values of the displacement sensors 20 rarely decrease from the reference values even though the mounting table 11 is raised by the distance suitable for the registered overdriving amount. Further, since the control unit 14 calculates an overdriving amount based on the measurement values from the displacement sensors 20, it makes a determination that the current overdriving amount has not yet reached the registered overdriving amount, so that the mounting table 11 is further lifted.

If the mounting table 11 is kept on being lifted, the measurement values of the displacement sensors 20 decrease gradually, and the distance between the mounting surface of the mounting table 11 and the bottom surface of the card holder 15 is reduced. In the meantime, the control unit 14 continuously calculates the difference between the reference value and the measurement value, that is, the current overdriving amount, and compares it with the registered overdriving amount. If the lifting of the interface mechanism reaches a limit and if the current overdriving amount, which is calculated by the control unit 14 based on the measurement values from the displacement sensors 20, becomes identical with the registered overdriving amount, the control unit 14 transmits a stop signal to the elevation driving mechanism 18A and thereby stops the mounting table 11. If the wafer W and probes 12A are allowed to contact with each other electrically by the proper overdriving operation of the mounting table 11, inspection of electrical characteristics of all the chips on the wafer W is carried out based on signals from the tester. Then, the inspected wafer W is replaced with a new wafer W yet to be inspected, and the same inspection process is performed on all of wafers W involved.

In accordance with the present embodiment described above, the distance between the mounting surface of the mounting table 11 and the bottom surface of the card holder 15 is measured by using the displacement sensors 20 provided in the mounting table 11, and the overdriving amount of the mounting table 11 is monitored based on the measurement results of the displacement sensors 20. Thus, it is possible to monitor the overdriving amount directly.

In accordance with the present invention, it can be directly detected whether a desired overdriving amount of the mounting table 11 is obtained even in case the wafer W and the probe card 12 come into contact with each other simultaneously so that the interface mechanism including the probe card 12 is lifted due to the contact load.

Furthermore, in accordance with the embodiment of the present invention, the control unit 14 regulates the lifting amount of the mounting table 11 based on the measurement results of the displacement sensors 20 until the desired overdriving amount of the mounting table 11 is obtained. Thus, even if the interface mechanism is lifted up due to the simultaneous contact between the wafer W and the probes 12A, it is possible to overdrive the mounting table 11 to bring the wafer W into electrical contact with the probes 12A securely. Therefore, inspection reliability can be improved.

Moreover, in accordance with the present embodiment, since the displacement sensors 20 are provided at equi-distanced three different locations along the circumferential direction of the mounting table 11, the overdriving amount of the mounting table 11 can be detected accurately. Furthermore, since the displacement sensors 20 on the three different locations are used, the parallelism between the mounting table 11 and the probe card 12 can also be detected based on the measurements of the three displacement sensors 20.

Here, it is to be noted that the present invention is not limited to the above-described embodiment, but the constituent elements can be appropriately modified as necessary. For example, though the above embodiment has been described for the case where the wafer W and the probe card 12 come into contact with each other simultaneously, the present invention can also be applied to the case where the probes of the probe card come into contact with a limited part of chips on the wafer. Further, as for an inspection target object, the present invention can also be applied to the processing of a LCD (Liquid Crystal Display) substrate or the like, in addition to the wafer.

Moreover, though the displacement sensors 20 are provided directly under the card holder 15 to monitor the overdriving amount through the card holder 15, it is also possible to dispose the displacement sensors on the peripheral region of the mounting surface of the mounting table and to monitor the overdriving amount through the peripheral region of the probe card. Further, the displacement sensor is not limited to the capacitance sensor, but any conventionally known sensor can be appropriately employed as long as it can measure a distance.

The present invention can be appropriately used in an inspection apparatus.

While the invention has been shown and described with respect to the embodiment, it will be understood by those skilled in the art that various changes and modifications may be made without departing from the scope of the invention as defined in the following claims.

What is claimed is:

1. An inspection apparatus for inspecting electrical characteristics of an inspection target object comprising:
    a movable mounting table for mounting the inspection target object thereon;
    a probe card disposed above the mounting table; and
    one or more displacement sensors, provided at one or more location of the mounting table, each of the sensors measuring a distance between the mounting table and the probe card or a vicinity thereof,
    wherein the inspection target object is brought into electrical contact with the probe card by overdriving the mounting table.

2. The inspection apparatus of claim 1, wherein the number of sensors is greater than one and the displacement sensors are provided at a peripheral portion of the mounting table to be distanced apart from each other at a regular interval.

3. The inspection apparatus of claim 1, wherein each of the sensors is a capacitance sensor.

4. An inspection apparatus for inspecting electrical characteristics of an inspection target object comprising:
    a movable mounting table for mounting the inspection target object thereon;
    a probe card disposed above the mounting table;
    a control unit for driving and controlling the mounting table; and
    one or more displacement sensors, provided at one or more locations of the mounting table, each of the sensors measuring a distance between the mounting table and the probe card or a vicinity thereof,
    wherein the control unit controls a lifting amount of the mounting table based on a measurement result of the displacement sensors, and
    wherein an entire surface of the inspection target object is brought into electrical contact with the probe card simultaneously by overdriving the mounting table under the control of the control unit.

5. The inspection apparatus of claim 4, wherein the number of sensors is greater than one and the displacement sensors are provided at a peripheral portion of the mounting table to be distanced apart from each other at a regular interval.

6. The inspection apparatus of claim 4, wherein each of the sensors is a capacitance sensor.

7. An inspection method for inspecting electrical characteristics of the inspection target object in an inspection apparatus, which includes a movable mounting table for mounting the inspection target object thereon, a probe card disposed above the mounting table, and a control unit for driving and controlling the mounting table, wherein the inspection target object is brought into electrical contact with the probe card by overdriving the mounting table under the control of the control unit, the method comprising:

measuring a distance between the mounting table and the probe card or a vicinity thereof by using one or more displacement sensors provided at the mounting table; and monitoring an overdriving amount of the mounting table based on a measurement result of the displacement sensors by the control unit.

8. The inspection method of claim 7, further comprising elevating the mounting table based on the measurement result of the displacement sensors by the control unit until a necessary overdriving amount is obtained.

9. The inspection method of claim 7, wherein the probe card has a plurality of probes which come into contact with electrode pads of the inspection target object simultaneously.

10. The inspection method of claim 7, wherein the displacement sensors are provided at plural equi-distanced locations along a circumferential direction of the mounting table.

* * * * *